(12) United States Patent
Yang et al.

(10) Patent No.: US 8,351,563 B2
(45) Date of Patent: Jan. 8, 2013

(54) SHIFT REGISTER CIRCUIT

(75) Inventors: Yu-Chung Yang, Hsin-Chu (TW);
Yung-Chih Chen, Hsin-Chu (TW);
Kuo-Hua Hsu, Hsin-Chu (TW);
Kuo-Chang Su, Hsin-Chu (TW)

(73) Assignee: AU Optronics Corp, Science-Based Industrial Park, Hsin-Chu (TW)

( * ) Notice: Subject to any disclaimer, the term of this patent is extended or adjusted under 35 U.S.C. 154(b) by 2 days.

(21) Appl. No.: 13/206,518

(22) Filed: Aug. 10, 2011

(65) Prior Publication Data

US 2012/0155604 A1  Jun. 21, 2012

(30) Foreign Application Priority Data

Dec. 16, 2010 (TW) .............................. 99144183 A (51) Int. Cl.
*G11C 19/00* (2006.01)

(52) U.S. Cl. ............................... 377/64; 377/68; 377/79

(58) Field of Classification Search ........................ None
See application file for complete search history.

(56) References Cited

U.S. PATENT DOCUMENTS

| | | | |
|---|---|---|---|
| 5,859,630 A * | 1/1999 | Huq .............................. | 345/100 |
| 8,208,598 B2 * | 6/2012 | Tsai et al. ...................... | 377/64 |
| 8,218,713 B2 * | 7/2012 | Hsu et al. ........................ | 377/64 |
| 2009/0135991 A1 | 5/2009 | Chen | |
| 2010/0260312 A1 * | 10/2010 | Tsai et al. ...................... | 377/79 |
| 2010/0316182 A1 | 12/2010 | Lai | |
| 2011/0150169 A1 * | 6/2011 | Lin et al. ......................... | 377/64 |
| 2011/0280362 A1 * | 11/2011 | Jang ............................... | 377/64 |
| 2012/0140871 A1 * | 6/2012 | Yang et al. ...................... | 377/79 |
| 2012/0153996 A1 * | 6/2012 | Su et al. ........................ | 327/109 |
| 2012/0169581 A1 * | 7/2012 | Su et al. ........................ | 345/100 |
| 2012/0169703 A1 * | 7/2012 | Yang et al. .................... | 345/212 |

* cited by examiner

*Primary Examiner* — Tuan T Lam
(74) *Attorney, Agent, or Firm* — Winston Hsu; Scott Margo (57) ABSTRACT

A shift register circuit includes plural shift register stages for providing plural gate signals. The Nth shift register stage of the shift register stages includes an input unit, a pull-up unit and a pull-down unit. The input unit is put in use for outputting an Nth driving control voltage according to an (N−1)th gate signal and an (N−2)th driving control voltage which are generated respectively by the (N−1)th shift register stage and the (N−2)th shift register stage of the shift register stages. The pull-up unit pulls up an Nth gate signal according to the Nth driving control voltage and a system clock. The pull-down unit pulls down the Nth gate signal and the Nth driving control voltage according to an (N+2)th gate signal generated by the (N+2)th shift register stage of the shift register stages.

10 Claims, 5 Drawing Sheets

SHIFT REGISTER CIRCUIT

BACKGROUND OF THE INVENTION

1. Field of the Invention

The present invention relates to a shift register circuit, and more particularly, to a shift register circuit having high driving ability.

2. Description of the Prior Art

Liquid crystal displays (LCDs) have advantages of a thin profile, low power consumption, and low radiation, and are broadly adopted for application in media players, mobile phones, personal digital assistants (PDAs), computer displays, and flat screen televisions. The operation of a liquid crystal display is featured by modulating the voltage drop across opposite sides of a liquid crystal layer for twisting the angles of liquid crystal molecules in the liquid crystal layer so that the transmittance of the liquid crystal layer can be controlled for illustrating images with the aid of light source provided by a backlight module. In general, the liquid crystal display comprises plural pixel units, a source driver, and a shift register circuit. The source driver is utilized for providing plural data signals to be written into the pixel units. The shift register circuit comprises a plurality of shift register stages and functions to generate plural gate signals for controlling the operations of writing the data signals into the pixel units. That is, the shift register circuit is a crucial device for providing a control of writing the data signals into the pixel units.

Figure 1:
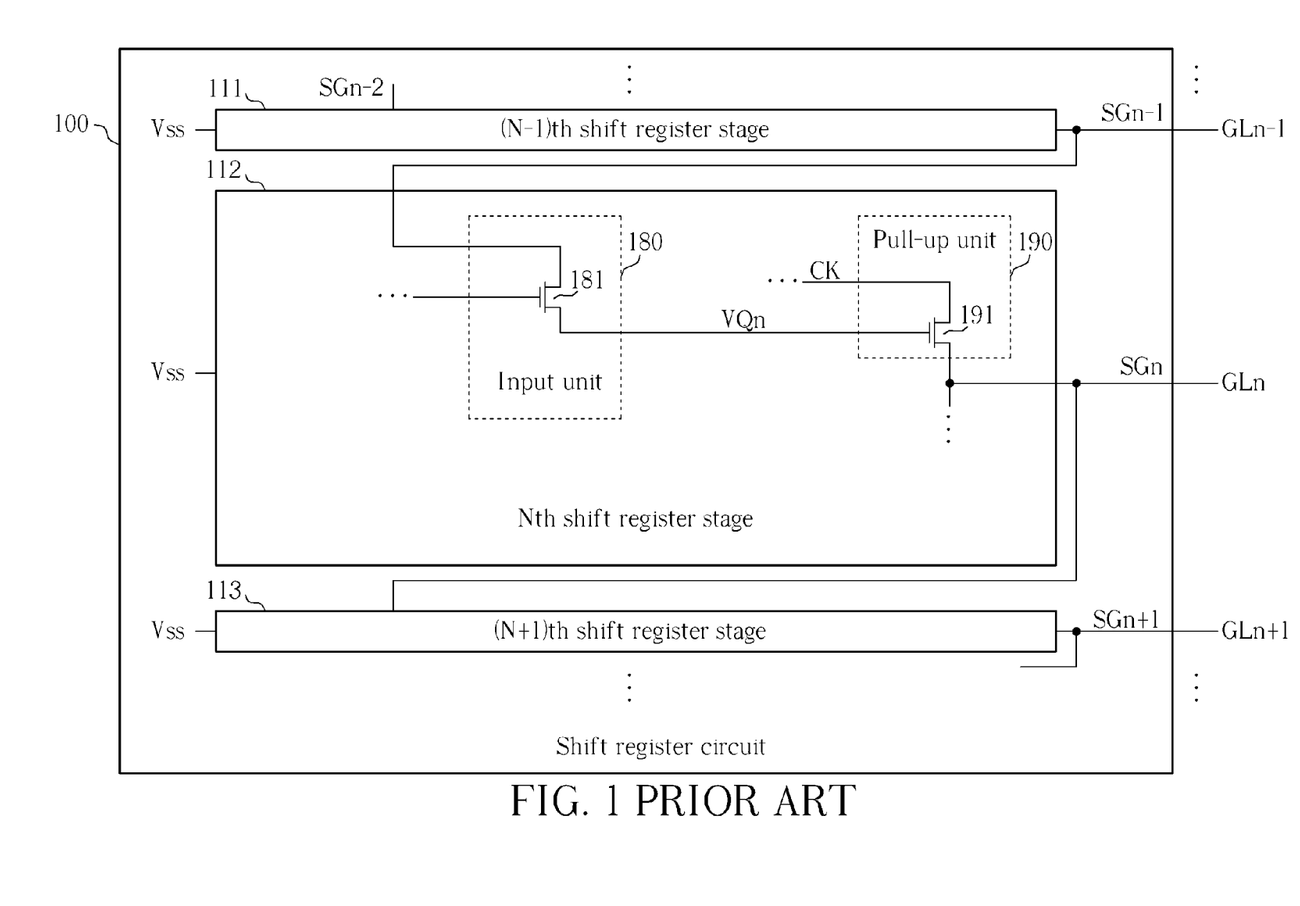
FIG. 1 is a schematic diagram showing a prior-art shift register circuit.

FIG. 1 is a schematic diagram showing a prior-art shift register circuit. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is employed to generate one corresponding gate signal furnished to one corresponding gate line according to a gate signal generated by one preceding shift register stage. For instance, the (N−1)th shift register stage 111 is utilized for generating a gate signal SGn−1 furnished to a gate line GLn−1 according to a gate signal SGn−2, the Nth shift register stage 112 is utilized for generating a gate signal SGn furnished to a gate line GLn according to the gate signal SGn−1, and the (N+1)th shift register stage 113 is utilized for generating a gate signal SGn+1 furnished to a gate line GLn+1 according to the gate signal SGn. In the operation of the Nth shift register stage 112, the input transistor 181 of an input unit 180 comprises a first end for receiving the gate signal SGn−1, a gate end for receiving a control signal, and a second end for outputting a driving control voltage VQn. As the gate signal SGn−1 and the control signal are both at a high-level voltage, the second end of the input transistor 181 outputs the driving control voltage VQn which is lower than the high-level voltage by the threshold voltage of the input transistor 181. Thereafter, the driving control voltage VQn is further pulled up to an active voltage by the rising edge of a system clock CK through coupling of the device capacitor of a pull-up transistor 191 in a pull-up unit 190. The active voltage is then employed to drive the pull-up unit 190 for generating the gate signal SGn. However, the active voltage is lower than twice the high-level voltage by the threshold voltage of the input transistor 181. That is, the output driving ability of the pull-up unit 190 is significantly lowered by the threshold voltage of the input transistor 181 in the operation of the Nth shift register stage 112.

SUMMARY OF THE INVENTION

In accordance with one embodiment of the present invention, a shift register circuit is disclosed for providing plural gate signals to plural gate lines. The shift register circuit comprises a plurality of shift register stages. And an Nth shift register stage of the shift register stages comprises an input unit, a pull-up unit, an energy-store unit, and a pull-down unit.

The input unit is electrically connected to an (N−1)th shift register stage of the shift register stages for receiving an (N−1)th gate signal of the gate signals, and is electrically connected to an (N−2)th shift register stage of the shift register stages for receiving an (N−2)th driving control voltage. The input unit is utilized for outputting an Nth driving control voltage according to the (N−1)th gate signal and the (N−2)th driving control voltage. The pull-up unit, electrically connected to the input unit and an Nth gate line of the gate lines, is utilized for pulling up an Nth gate signal of the gate signals according to the Nth driving control voltage and a system clock. The Nth gate line is employed to transmit the Nth gate signal. The energy-store unit, electrically connected to the pull-up unit and the input unit, is employed to perform a charging/discharging process based on the Nth driving control voltage. The pull-down unit is electrically connected to the input unit and the Nth gate line, and is electrically connected to an (N+2)th shift register stage of the shift register stages for receiving an (N+2)th gate signal of the gate signals. The pull-down unit is utilized for pulling down the Nth gate signal and the Nth driving control voltage according to the (N+2)th gate signal.

In accordance with another embodiment of the present invention, a shift register circuit is disclosed for providing plural gate signals to plural gate lines. The shift register circuit comprises a plurality of shift register stages. And an Nth shift register stage of the shift register stages comprises an input unit, a pull-up unit, a carry unit, an energy-store unit, and a pull-down unit.

The input unit is electrically connected to an (N−1)th shift register stage of the shift register stages for receiving an (N−1)th start pulse signal, and is electrically connected to an (N−2)th shift register stage of the shift register stages for receiving an (N−2)th driving control voltage. The input unit is utilized for outputting an Nth driving control voltage according to the (N−1)th start pulse signal and the (N−2)th driving control voltage. The pull-up unit, electrically connected to the input unit and an Nth gate line of the gate lines, is utilized for pulling up an Nth gate signal of the gate signals according to the Nth driving control voltage and a system clock. The Nth gate line is employed to transmit the Nth gate signal. The carry unit, electrically connected to the input unit, is utilized for outputting an Nth start pulse signal according to the Nth driving control voltage and the system clock. The energy-store unit, electrically connected to the pull-up unit and the input unit, is employed to perform a charging/discharging process based on the Nth driving control voltage. The pull-down unit is electrically connected to the input unit and the Nth gate line, and is electrically connected to an (N+2)th shift register stage of the shift register stages for receiving an (N+2)th gate signal of the gate signals. The pull-down unit is utilized for pulling down the Nth gate signal and the Nth driving control voltage according to the (N+2)th gate signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 2:
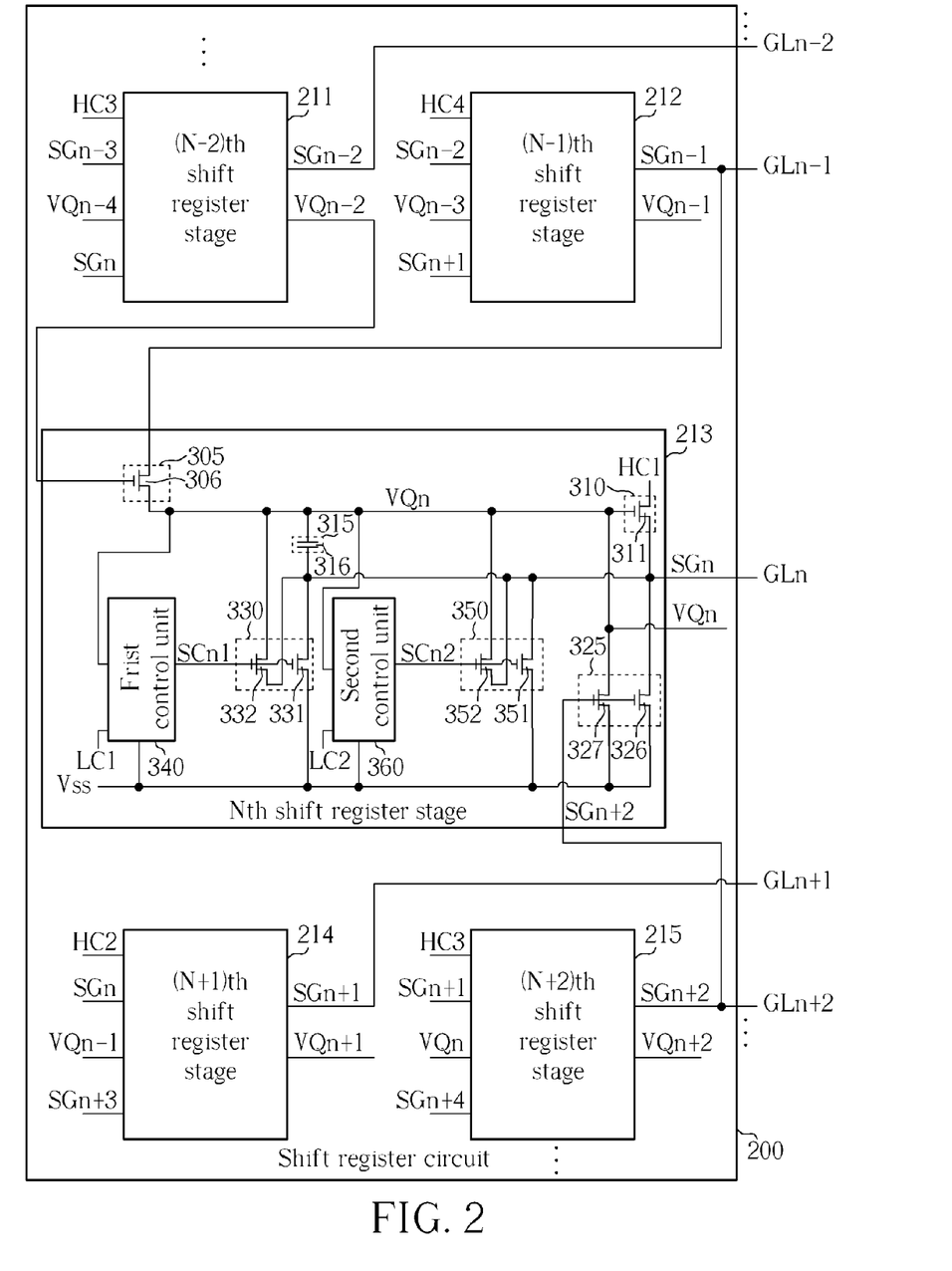
FIG. 2 is a schematic diagram showing a shift register circuit in accordance with a first embodiment of the present invention.

FIG. 2 is a schematic diagram showing a shift register circuit in accordance with a first embodiment of the present invention. As shown in FIG. 2, the shift register circuit 200 comprises a plurality of shift register stages and, for ease of explanation, illustrates an (N−2)th shift register stage 211, an (N−1)th shift register stage 212, an Nth shift register stage 213, an (N+1)th shift register stage 214 and an (N+2)th shift register stage 215. For the sake of brevity, only the internal structure of the Nth shift register stage 213 is exemplified in detail. The internal structures of other shift register stages are similar to the Nth shift register stage 213 and can be inferred by analogy. In the operation of the shift register circuit 200, the Nth shift register stage 213 is utilized for performing a circuit operation with high driving ability to generate a gate signal SGn and a driving control voltage VQn according to a driving control voltage VQn−2 generated by the (N−2)th shift register stage 211, a gate signal SGn−1 generated by the (N−1)th shift register stage 212, a gate signal SGn+2 generated by the (N+2)th shift register stage 215, a first system clock HC1, a first clock LC1, a second clock LC2 having a phase opposite to the first clock LC1, and a power voltage Vss. The circuit functions of other shift register stages are similar to the Nth shift register stage 213 and can be inferred by analogy. Regarding the system clocks HC1-HC4 shown in FIG. 2, it is noted that the third system clock HC3 has a phase opposite to the first system clock HC1, the second system clock HC2 has a 90-degree phase difference relative to the first system clock HC1, and the fourth system clock HC4 has a phase opposite to the second system clock HC2.

The Nth shift register stage 213 comprises an input unit 305, a pull-up unit 310, an energy-store unit 315, a pull-down unit 325, a first auxiliary pull-down unit 330, a first control unit 340, a second auxiliary pull-down unit 350, and a second control unit 360. The input unit 305 is electrically connected to the (N−1)th shift register stage 212 for receiving the gate signal SGn−1, and is further electrically connected to the (N−2)th shift register stage 211 for receiving the driving control voltage VQn−2. The input unit 305 is utilized for outputting the driving control voltage VQn according to the gate signal SGn−1 and the driving control voltage VQn−2. The pull-up unit 310, electrically connected to the input unit 305 and the gate line GLn, is utilized for pulling up the gate signal SGn of the gate line GLn according to the driving control voltage VQn and the first system clock HC1. The gate line GLn is employed to transmit the gate signal SGn. The energy-store unit 315, electrically connected to the input unit 305 and the pull-up unit 310, functions to perform a charging/discharging process based on the driving control voltage VQn. The pull-down unit 325 is electrically connected to the input unit 305 and the gate line GLn, and is further electrically connected to the (N+2)th shift register stage 215 for receiving the gate signal SGn+2. The pull-down unit 325 is utilized for pulling down the gate signal SGn and the driving control voltage VQn according to the gate signal SGn+2.

The first control unit 340, electrically connected to the input unit 305, is utilized for generating a first control signal SCn1 according to the driving control voltage VQn and the first clock LC1. The first auxiliary pull-down unit 330, electrically connected to the first control unit 340, the input unit 305 and the gate line GLn, is utilized for pulling down the gate signal SGn and the driving control voltage VQn according to the first control signal SCn1. The second control unit 360, electrically connected to the input unit 305, is utilized for generating a second control signal SCn2 according to the driving control voltage VQn and the second clock LC2. The second auxiliary pull-down unit 350, electrically connected to the second control unit 360, the input unit 305 and the gate line GLn, is utilized for pulling down the gate signal SGn and the driving control voltage VQn according to the second control signal SCn2.

In the embodiment shown in FIG. 2, the input unit 305 comprises a first transistor 306, the pull-up unit 310 comprises a second transistor 311, the energy-store unit 315 comprises a capacitor 316, the pull-down unit 325 comprises a third transistor 326 and a fourth transistor 327, the first auxiliary pull-down unit 330 comprises a ninth transistor 331 and a tenth transistor 332, and the second auxiliary pull-down unit 350 comprises a fifteenth transistor 351 and a sixteenth transistor 352. It is noted that each of the transistors aforementioned or to be mentioned may be a thin film transistor (TFT), a field effect transistor (FET) or other similar device having connection/disconnection switching functionality.

The first transistor 306 comprises a first end electrically connected to the (N−1)th shift register stage 212 for receiving the gate signal SGn−1, a gate end electrically connected to the (N−2)th shift register stage 211 for receiving the driving control voltage VQn−2, and a second end for outputting the driving control voltage VQn. The second transistor 311 comprises a first end for receiving the first system clock HC1, a gate end electrically connected to the second end of the first transistor 306 for receiving the driving control voltage VQn, and a second end electrically connected to the gate line GLn. The capacitor 316 is electrically connected between the gate and second ends of the second transistor 311. The third transistor 326 comprises a first end electrically connected to the gate line GLn, a gate end electrically connected to the (N+2)th shift register stage 215 for receiving the gate signal SGn+2, and a second end for receiving the power voltage Vss. The fourth transistor 327 comprises a first end electrically connected to the second end of the first transistor 306, a gate end electrically connected to the (N+2)th shift register stage 215 for receiving the gate signal SGn+2, and a second end for receiving the power voltage Vss.

The ninth transistor 331 comprises a first end electrically connected to the gate line GLn, a gate end electrically connected to the first control unit 340 for receiving the first control signal SCn1, and a second end for receiving the power voltage Vss. The tenth transistor 332 comprises a first end electrically connected to the second end of the first transistor 306, a gate end electrically connected to the first control unit 340 for receiving the first control signal SCn1, and a second end electrically connected to the gate line GLn. The fifteenth transistor 351 comprises a first end electrically connected to the gate line GLn, a gate end electrically connected to the second control unit 360 for receiving the second control signal SCn2, and a second end for receiving the power voltage Vss. The sixteenth transistor 352 comprises a first end electrically connected to the second end of the first transistor 306, a gate end electrically connected to the second control unit 360 for receiving the second control signal SCn2, and a second end electrically connected to the gate line GLn.

Figure 3:
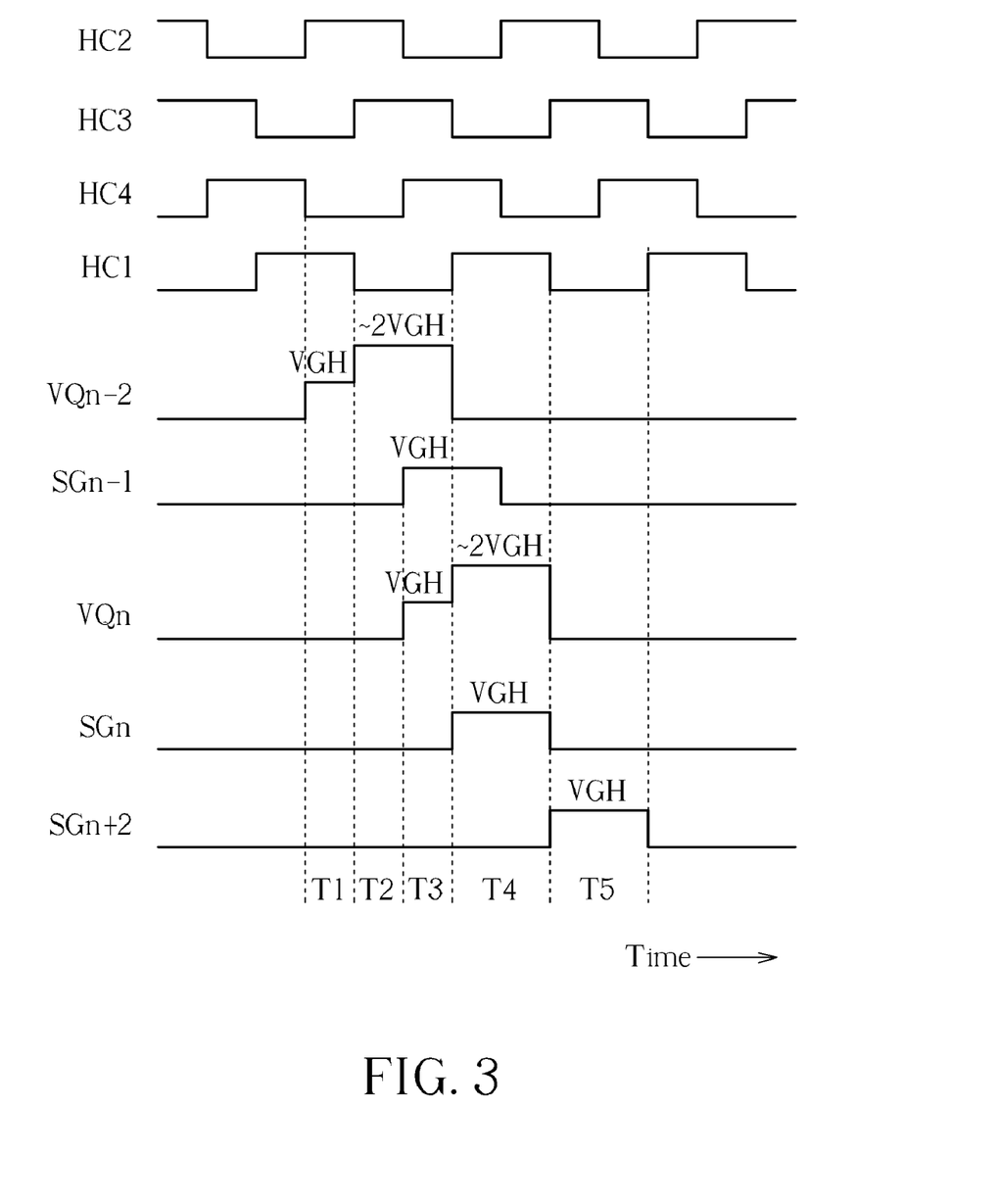
FIG. 3 is a schematic diagram showing related signal waveforms regarding the operation of the shift register circuit illustrated in FIG. 2, having time along the abscissa.

FIG. 3 is a schematic diagram showing related signal waveforms regarding the operation of the shift register circuit 200 illustrated in FIG. 2, having time along the abscissa. The signal waveforms in FIG. 3, from top to bottom, are the second system clock HC2, the third system clock HC3, the fourth system clock HC4, the first system clock HC1, the driving control voltage VQn−2, the gate signal SGn−1, the driving control voltage VQn, the gate signal SGn, and the gate signal SGn+2. As shown in FIG. 3, during an interval T1, the (N−2) th shift register stage 211 employs the driving control voltage VQn−4 and the gate signal SGn−3 to pull the driving control voltage VQn−2 up to the high-level voltage VGH of system clock. During an interval T2, the (N−2) th shift register stage 211 employs the rising edge of the third system clock HC3 to pull the driving control voltage VQn−2 further up to approximate 2VGH. During an interval T3, the (N−1) th shift register stage 212 outputs the gate signal SGn−1 having the high-level voltage VGH while the driving control voltage VQn−2 retains the voltage of approximate 2VGH. For that reason, the first transistor 306 of the Nth shift register stage 213 is capable of pulling the driving control voltage VQn up to the high-level voltage VGH according to the driving control voltage VQn−2 and the gate signal SGn−1 during the interval T3. It is noted that since the voltage at the gate end of the first transistor 306 approximates 2VGH during the interval T3, the driving control voltage VQn at the second end of the first transistor 306 is able to reach the high-level voltage VGH, i.e. without being lowered by the threshold voltage of the first transistor 306. During an interval T4, the driving control voltage VQn is further boosted from VGH to approximate 2VGH by the rising edge of the first system clock HC1 through coupling of the device capacitor of the second transistor 311, and the second transistor 311 is then turned on for pulling the gate signal SGn up to the high-level voltage VGH.

During an interval T5, the (N+2)th shift register stage 215 outputs the gate signal SGn+2 having the high-level voltage VGH, and therefore the third transistor 326 and the fourth transistor 327 of the Nth shift register stage 213 are both turned on by the gate signal SGn+2 for pulling the gate signal SGn and the driving control voltage VQn down to the power voltage Vss. According to the above description regarding the operation of the Nth shift register stage 213, the gate signal SGn is pulled up by the second transistor 311 having high output driving ability according to the driving control voltage VQn of approximate 2VGH, thereby enhancing pixel charging rate to improve display quality.

Figure 4:
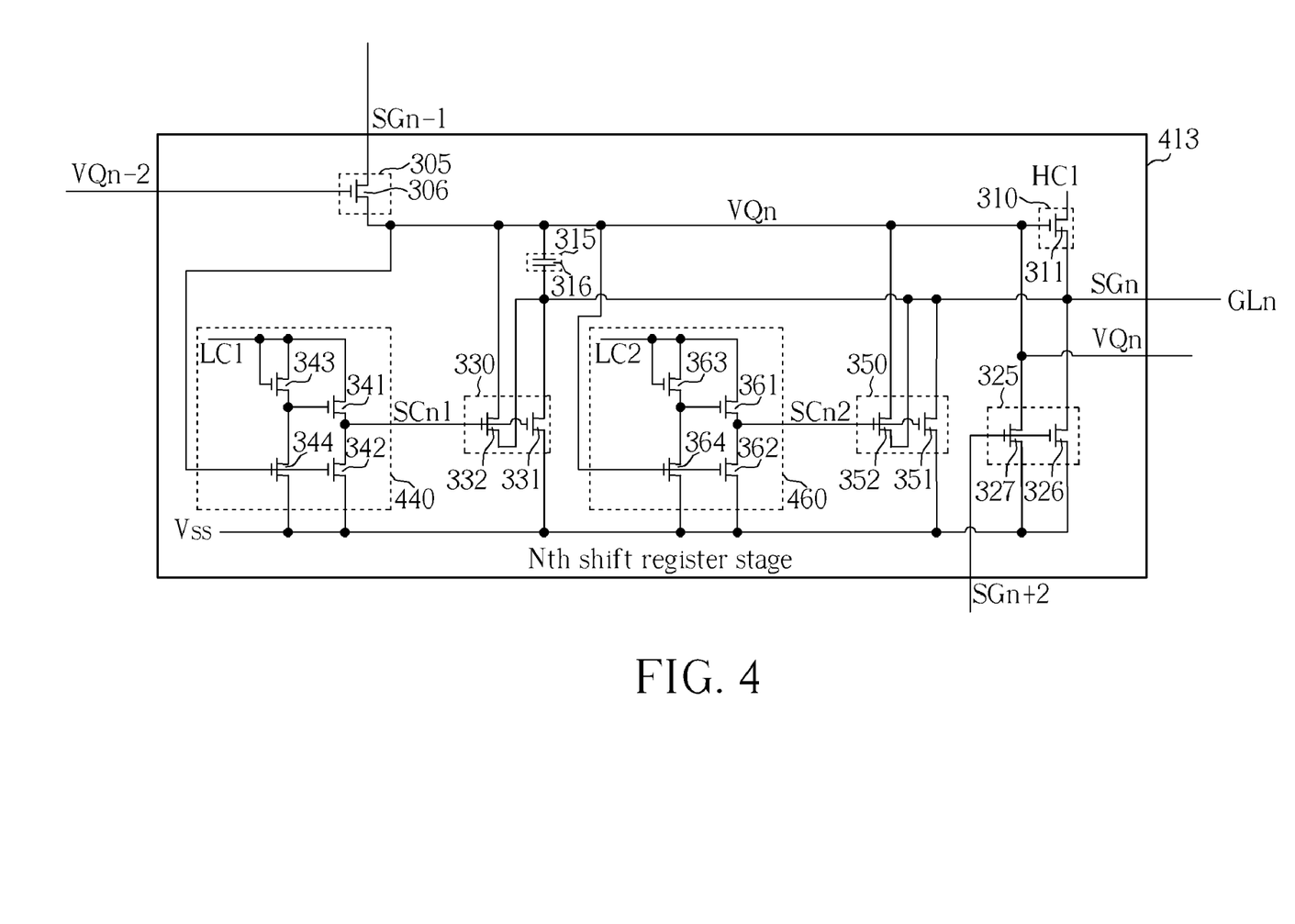
FIG. 4 is a schematic diagram showing another embodiment of the Nth shift register stage of the shift register circuit illustrated in FIG. 2.

FIG. 4 is a schematic diagram showing another embodiment of the Nth shift register stage of the shift register circuit illustrated in FIG. 2. As shown in FIG. 4, the Nth shift register stage 413 is similar to the Nth shift register stage 213 shown in FIG. 2, differing in that the first control unit 340 is replaced with a first control unit 440, and the second control unit 360 is replaced with a second control unit 460. In the embodiment shown in FIG. 4, the first control unit 440 comprises a fifth transistor 341, a sixth transistor 342, a seventh transistor 343 and an eighth transistor 344, and the second control unit 460 comprises an eleventh transistor 361, a twelfth transistor 362, a thirteenth transistor 363 and a fourteenth transistor 364.

The fifth transistor 341 comprises a first end for receiving the first clock LC1, a second end for outputting the first control signal SCn1, and a gate end electrically connected to the seventh transistor 343. The sixth transistor 342 comprises a first end electrically connected to the second end of the fifth transistor 341, a gate end electrically connected to the second end of the first transistor 306, and a second end for receiving the power voltage Vss. The seventh transistor 343 comprises a first end for receiving the first clock LC1, a gate end for receiving the first clock LC1, and a second end electrically connected to the gate end of the fifth transistor 341. The eighth transistor 344 comprises a first end electrically connected to the second end of the seventh transistor 343, a gate end electrically connected to the second end of the first transistor 306, and a second end for receiving the power voltage Vss.

The eleventh transistor 361 comprises a first end for receiving the second clock LC2, a second end for outputting the second control signal SCn2, and a gate end electrically connected to the thirteenth transistor 363. The twelfth transistor 362 comprises a first end electrically connected to the second end of the eleventh transistor 361, a gate end electrically connected to the second end of the first transistor 306, and a second end for receiving the power voltage Vss. The thirteenth transistor 363 comprises a first end for receiving the second clock LC2, a gate end for receiving the second clock LC2, and a second end electrically connected to the gate end of the eleventh transistor 361. The fourteenth transistor 364 comprises a first end electrically connected to the second end of the thirteenth transistor 363, a gate end electrically connected to the second end of the first transistor 306, and a second end for receiving the power voltage Vss. The circuit operations regarding the fifth through eighth transistors 341-344 and the eleventh through fourteenth transistors 361-364 are well known to those skilled in the art and, for the sake of brevity, further discussion thereof is omitted. Other circuit functions of the Nth shift register stage 413 are similar to those of the Nth shift register stage 213, and are not described again here.

Figure 5:
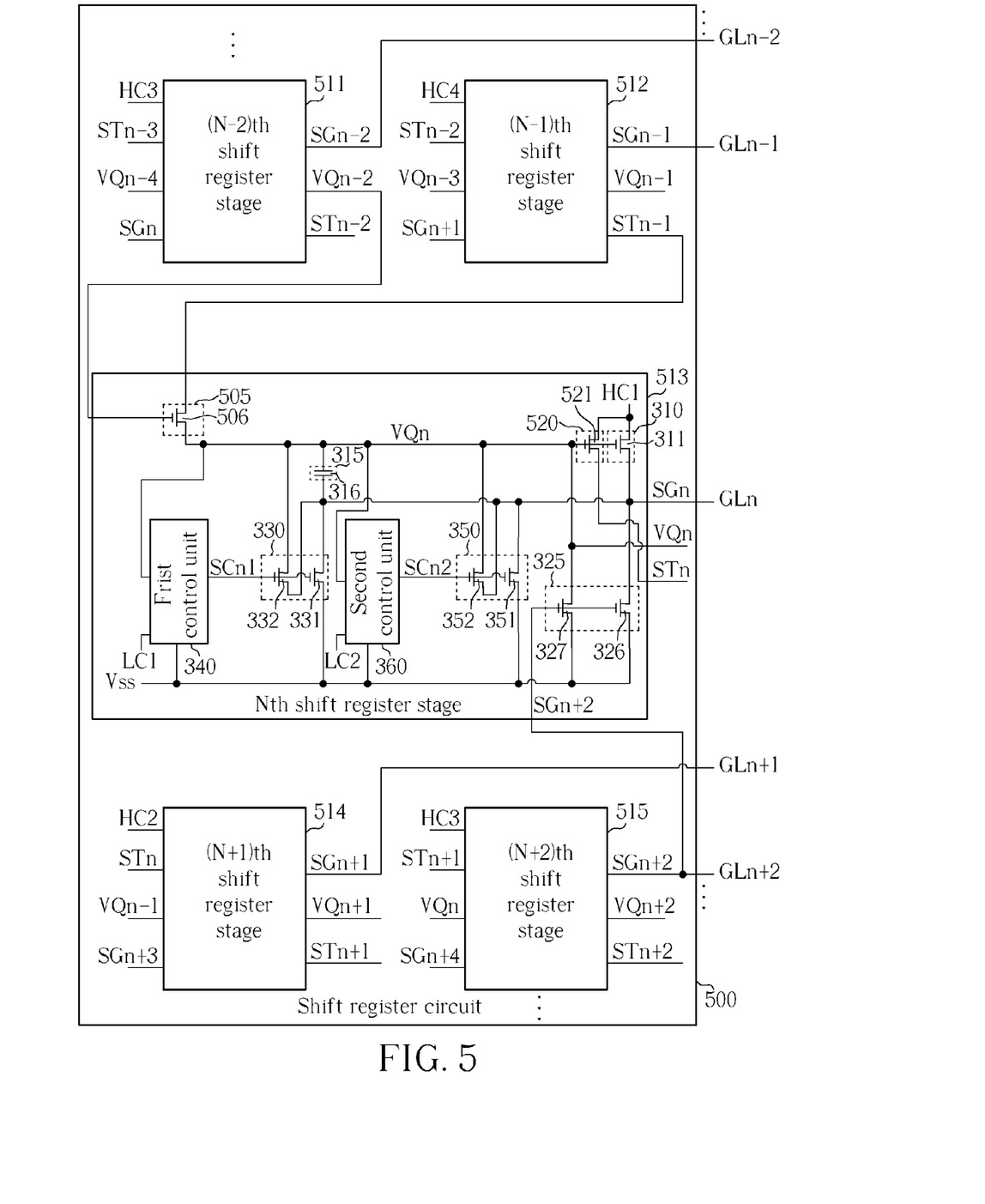
FIG. 5 is a schematic diagram showing a shift register circuit in accordance with a second embodiment of the present invention.

FIG. 5 is a schematic diagram showing a shift register circuit in accordance with a second embodiment of the present invention. As shown in FIG. 5, the shift register circuit 500 comprises a plurality of shift register stages and, for ease of explanation, illustrates an (N−2) th shift register stage 511, an (N−1) th shift register stage 512, an Nth shift register stage 513, an (N+1)th shift register stage 514 and an (N+2)th shift register stage 515. For the sake of brevity, only the internal structure of the Nth shift register stage 513 is exemplified in detail. The internal structures of other shift register stages are similar to the Nth shift register stage 513 and can be inferred by analogy. In the operation of the shift register circuit 500, the Nth shift register stage 513 is utilized for performing a circuit operation with high driving ability to generate a gate signal SGn, a start pulse signal STn and a driving control voltage VQn according to a driving control voltage VQn−2 generated by the (N−2) th shift register stage 511, a start pulse signal STn−1 generated by the (N−1) th shift register stage 512, a gate signal SGn+2 generated by the (N+2) th shift register stage 515, a first system clock HC1, a first clock LC1, a second clock LC2 having a phase opposite to the first clock LC1, and a power voltage Vss. The circuit functions of other shift register stages are similar to the Nth shift register stage 513 and can be inferred by analogy. Regarding the system clocks HC1-HC4 shown in FIG. 5, it is noted that the third system clock HC3 has a phase opposite to the first system clock HC1, the second system clock HC2 has a 90-degree phase difference relative to the first system clock HC1, and the fourth system clock HC4 has a phase opposite to the second system clock HC2.

As shown in FIG. 5, the Nth shift register stage 513 is similar to the Nth shift register stage 213 shown in FIG. 2, differing in that the input unit 305 is replaced with an input unit 505, and a carry unit 520 is further added. The input unit 505 is electrically connected to the (N−1) th shift register stage 512 for receiving the start pulse signal STn−1, and is further electrically connected to the (N−2) th shift register stage 511 for receiving the driving control voltage VQn−2. The input unit 505 is utilized for outputting the driving control voltage VQn according to the start pulse signal STn−1 and the driving control voltage VQn−2. The carry unit 520, electrically connected to the input unit 505, is utilized for outputting the start pulse signal STn according to the driving control voltage VQn and the first system clock HC1.

In the embodiment shown in FIG. 5, the input unit 505 comprises a first transistor 506, and the carry unit 520 comprises a seventeenth transistor 521. The first transistor 506 comprises a first end electrically connected to the (N−1) th shift register stage 512 for receiving the start pulse signal STn−1, a gate end electrically connected to the (N−2) th shift register stage 511 for receiving the driving control voltage VQn−2, and a second end for outputting the driving control voltage VQn. The seventeenth transistor 521 comprises a first end for receiving the first system clock HC1, a gate end electrically connected to the second end of the first transistor 506 for receiving the driving control voltage VQn, and a second end for outputting the start pulse signal STn. Since the waveform of the start pulse signal STn is substantially identical to that of the gate signal SGn, the circuit operation of the Nth shift register stage 513 is therefore similar to that of the Nth shift register stage 213 and, for the sake of brevity, further discussion thereof is not described again here.

To sum up, in the operation of the shift register circuit according to the present invention, while pulling up one gate signal by a corresponding pull-up unit, the corresponding pull-up unit is driven by a driving control voltage of approximate twice the high-level voltage of system clock so as to achieve high output driving ability, thereby enhancing pixel charging rate for improving display quality.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:
an input unit, electrically connected to an (N−1)th shift register stage of the shift register stages for receiving an (N−1)th start pulse signal, and electrically connected to an (N−2)th shift register stage of the shift register stages for receiving an (N−2)th driving control voltage, for outputting an Nth driving control voltage according to the (N−1)th start pulse signal and the (N−2)th driving control voltage;
a pull-up unit, electrically connected to the input unit and an Nth gate line of the gate lines, for pulling up an Nth gate signal of the gate signals according to the Nth driving control voltage and a system clock, wherein the Nth gate line is employed to transmit the Nth gate signal;
an energy-store unit, electrically connected to the pull-up unit and the input unit, for performing a charging/discharging process based on the Nth driving control voltage; and
a pull-down unit, electrically connected to the input unit and the Nth gate line, and electrically connected to an (N+2)th shift register stage of the shift register stages for receiving an (N+2)th gate signal of the gate signals, for pulling down the Nth gate signal and the Nth driving control voltage according to the (N+2)th gate signal.

2. The shift register circuit of claim 1, further comprising:
a carry unit, electrically connected to the input unit, for outputting an Nth start pulse signal according to the Nth driving control voltage and the system clock.

3. The shift register circuit of claim 2, wherein the input unit comprises a first transistor having a first end electrically connected to the (N−1)th shift register stage for receiving the (N−1)th start pulse signal, a gate end electrically connected to the (N−2)th shift register stage for receiving the (N−2)th driving control voltage, and a second end for outputting the Nth driving control voltage.

4. The shift register circuit of claim 2, wherein:
the pull-up unit comprises a second transistor having a first end for receiving the system clock, a gate end for receiving the Nth driving control voltage, and a second end electrically connected to the Nth gate line;
the energy-store unit comprises a capacitor electrically connected between the gate and second ends of the second transistor; and
the pull-down unit comprises:
a third transistor having a first end electrically connected to the Nth gate line, a gate end electrically connected to the (N+2)th shift register stage for receiving the (N+2)th gate signal, and a second end for receiving a power voltage; and
a fourth transistor having a first end electrically connected to the input unit, a gate end electrically connected to the (N+2)th shift register stage for receiving the (N+2)th gate signal, and a second end for receiving the power voltage.

5. The shift register circuit of claim 2, wherein the Nth shift register stage further comprises:
a first control unit, electrically connected to the input unit, for generating a first control signal according to the Nth driving control voltage and a first clock; and
a first auxiliary pull-down unit, electrically connected to the first control unit, the input unit and the Nth gate line, for pulling down the Nth gate signal and the Nth driving control voltage according to the first control signal.

6. The shift register circuit of claim 5, wherein:
the first control unit comprises:
a fifth transistor having a first end for receiving the first clock, a gate end, and a second end for outputting the first control signal;
a sixth transistor having a first end electrically connected to the second end of the fifth transistor, a gate end for receiving the Nth driving control voltage, and a second end for receiving a power voltage;
a seventh transistor having a first end for receiving the first clock, a gate end for receiving the first clock, and a second end electrically connected to the gate end of the fifth transistor; and
an eighth transistor having a first end electrically connected to the second end of the seventh transistor, a gate end for receiving the Nth driving control voltage, and a second end for receiving the power voltage; and the first auxiliary pull-down unit comprises:
- a ninth transistor having a first end electrically connected to the Nth gate line, a gate end for receiving the first control signal, and a second end for receiving the power voltage; and
- a tenth transistor having a first end electrically connected to the input unit, a gate end for receiving the first control signal, and a second end electrically connected to the Nth gate line.

7. The shift register circuit of claim 5, wherein the Nth shift register stage further comprises:
- a second control unit, electrically connected to the input unit, for generating a second control signal according to the Nth driving control voltage and a second clock having a phase opposite to the first clock; and
- a second auxiliary pull-down unit, electrically connected to the second control unit, the input unit and the Nth gate line, for pulling down the Nth gate signal and the Nth driving control voltage according to the second control signal.

8. The shift register circuit of claim 7, wherein:
the second control unit comprises:
- an eleventh transistor having a first end for receiving the second clock, a gate end, and a second end for outputting the second control signal;
- a twelfth transistor having a first end electrically connected to the second end of the eleventh transistor, a gate end for receiving the Nth driving control voltage, and a second end for receiving a power voltage;
- a thirteenth transistor having a first end for receiving the second clock, a gate end for receiving the second clock, and a second end electrically connected to the gate end of the eleventh transistor; and
- a fourteenth transistor having a first end electrically connected to the second end of the thirteenth transistor, a gate end for receiving the Nth driving control voltage, and a second end for receiving the power voltage; and the second auxiliary pull-down unit comprises:
- a fifteenth transistor having a first end electrically connected to the Nth gate line, a gate end for receiving the second control signal, and a second end for receiving the power voltage; and
- a sixteenth transistor having a first end electrically connected to the input unit, a gate end for receiving the second control signal, and a second end electrically connected to the Nth gate line.

9. The shift register circuit of claim 2, wherein the carry unit comprises a seventeenth transistor having a first end for receiving the system clock, a gate end for receiving the Nth driving control voltage, and a second end for outputting the Nth start pulse signal.

10. The shift register circuit of claim 9, wherein the shift register stages comprising a carry unit of an (N−1)th shift register stage for receiving a first system clock and a carry unit of an (N+1)th shift register stage for receiving a second system clock, wherein the second system clock has a phase opposite to the first system clock and the second system clock has a 90-degree phase difference relative to the system clock.

* * * * *